(12) United States Patent
Sever (10) Patent No.: US 9,844,165 B2
(45) Date of Patent: Dec. 12, 2017

(54) ADVANCED HEAT EXCHANGER WITH INTEGRATED COOLANT FLUID FLOW DEFLECTOR

(71) Applicant: Sieva, Podjetje Za Razvoj In Trzenje V Avtomobilski Industriji, D.O.O., Sempeter pri Gorici (SI)

(72) Inventor: Peter Sever, Crensovci (SI)

(73) Assignee: Sieva, Podjetje Za Razvoj In Trzenje V Avtomobilski Industriji, D. O. O. (SI)

( * ) Notice: Subject to any disclaimer, the term of this patent is extended or adjusted under 35 U.S.C. 154(b) by 364 days.

(21) Appl. No.: 14/773,313

(22) PCT Filed: Dec. 10, 2012

(86) PCT No.: PCT/SI2012/000065
§ 371 (c)(1),
(2) Date: Sep. 4, 2015

(87) PCT Pub. No.: WO2014/092655
PCT Pub. Date: Jun. 19, 2014

(65) Prior Publication Data
US 2016/0029516 A1 Jan. 28, 2016

(51) Int. Cl.
*F28F 7/00* (2006.01)
*H05K 7/20* (2006.01)
(Continued)

(52) U.S. Cl.
CPC ......... *H05K 7/20272* (2013.01); *F28F 3/022* (2013.01); *F28F 3/12* (2013.01);
(Continued)

(58) Field of Classification Search
CPC . H05K 7/20272; H05K 7/20409; F28F 3/022; F28F 3/12; F28F 13/06;
(Continued)

(56) References Cited

U.S. PATENT DOCUMENTS 6,173,758 B1 * 1/2001 Ward ................. F28F 3/022
165/185
7,652,884 B2 * 1/2010 Suzuki ................ G06F 1/203
165/80.4
(Continued)

FOREIGN PATENT DOCUMENTS

WO WO-2012/114475 A1 8/2012

Primary Examiner — Justin Jonaitis
(74) Attorney, Agent, or Firm — Fishman Stewart PLLC (57) ABSTRACT

A pin fin cooling system may include at least one first surface defining at least a base portion of the cooling system, and at least one pin fin array of a plurality of pin fins and at least one coolant fluid flow detector extending from the first surface. The coolant fluid flow deflector may be configured to split a coolant fluid flow from a primary flow into at least two secondary flows that follow a predetermined path over local heat sources, and may have a maximum wall thickness that is equal to a diameter of a cross-section of one of the pin fins. The cooling system may further include at least one boundary fin extending from the first surface that is in the shape of a spline, at least a portion of which may correspond and match at least a portion of a pattern of the pin fin array.

13 Claims, 9 Drawing Sheets

(51) Int. Cl.
  *F28F 3/02* (2006.01)
  *F28F 3/12* (2006.01)
  *F28F 13/06* (2006.01)
  *H01L 23/367* (2006.01)
  *H01L 23/473* (2006.01)
  *F28F 13/12* (2006.01)
  *F28D 21/00* (2006.01)

(52) U.S. Cl.
  CPC .............. *F28F 13/06* (2013.01); *F28F 13/12* (2013.01); *H01L 23/3677* (2013.01); *H01L 23/473* (2013.01); *H05K 7/20409* (2013.01); *F28D 2021/0028* (2013.01); *H01L 2924/0002* (2013.01)

(58) Field of Classification Search
  CPC .... F28F 13/12; H01L 23/3677; H01L 23/473; H01L 2924/0002; F28D 2021/0028
  USPC ........................................................ 165/80.4
  See application file for complete search history.

(56) References Cited

U.S. PATENT DOCUMENTS

| | | | | |
|---|---|---|---|---|
| 7,672,125 | B2 * | 3/2010 | Suzuki | G06F 1/203 165/80.4 |
| 2008/0066888 | A1 | 3/2008 | Tong et al. | |
| 2010/0242863 | A1 * | 9/2010 | Hubau | B22D 19/0063 122/367.1 |
| 2011/0042038 | A1 * | 2/2011 | Herron | H05K 7/20927 165/104.11 |
| 2011/0272120 | A1 * | 11/2011 | Joshi | F28D 1/0426 165/104.13 |
| 2012/0269615 | A1 * | 10/2012 | Kuwabara | F01D 5/187 415/116 |
| 2013/0028727 | A1 * | 1/2013 | Shinoda | F01D 9/065 415/208.1 |
| 2013/0220587 | A1 * | 8/2013 | Tamura | F28F 3/02 165/185 |
| 2016/0202003 | A1 * | 7/2016 | Gerstler | F02C 7/14 165/165 |

* cited by examiner

ADVANCED HEAT EXCHANGER WITH INTEGRATED COOLANT FLUID FLOW DEFLECTOR

CROSS-REFERENCE TO RELATED APPLICATIONS

This application claims priority to International Patent Application No. PCT/SI2012/000065, filed Dec. 10, 2012, the contents of which are hereby incorporated by reference in their entirety.

TECHNICAL FIELD

The object of this patent application relates to the heat exchangers as cooling system of power electronics. Such heat exchangers as Power Module Coolers are in the preferential embodiment designed as Pin Fin Coolers for high power applications in Motor and Motion Control, Hybrid Electric Vehicles and other Power Module systems.

BACKGROUND

Heat sinks are so-called extended surfaces that have been used to enhance cooling of heat dissipating surfaces. Such heat sinks have been fabricated in a number of designs. The designs are such as to decrease fluid flow impedance through the heat sink and thereby improve heat dissipation performance. The pin fin heat sink is of particular interest because it is one of the commonly used heat sinks.

The technological problem addressed by this patent-application is the lack of a heat exchanger that is easy to fabricate and manufacture, whilst maintaining a minimal number of components thus ensuring the low cost overall system implementation.

A significant number of relevant solutions are listed in the International Patent register. The following two describe the solutions that describe the state of the art in this area of technology.

According to US2008/0066888A1 (Danaher Motion Stockholm AB), the heat exchanger comprise the array of pin fins which are various in shape and position and thus some of those pin fins are arranged and acting as the coolant fluid deflector. Yet another solution as disclosed in U.S. Pat. No. 6,173,758 B1 (General Motors Corporation) incorporates plurality of extended straight pin fins various in shape and arranged in semicircular pattern, which are acting as coolant fluid deflector by forming the quasi channel for cooling fluid flow by drag force.

Pressure drop across a pin fin heat sink is one of the key variables that govern the thermal performance of the heat sink. Thus, the main and crucial disadvantage of stated solutions from prior art is that they are creating the flow deflection with unnecessary pressure drop and drag force, which contributes to higher pressure drop and pressure distribution distortion within the heat sink main cavity. Thus a problem of prior art pin fin heat sinks is to find the optimum configuration for controlled deflection of coolant fluid with minimum pressure drop.

SUMMARY

This invention relates to a cooling system having one or more pin fins for an electric motor controller. An object of the present invention is to provide a heat sink for liquid cooled applications with controlled deflection of coolant fluid flow, which is selectively focused and guided to the local heat sources in the power electronics applications by flow guide arrangement. The invention is based on insight that cooling fluid flow is selectively guided to the local heat sources by integrated fluid flow deflector. The integrated coolant fluid guide is herein after referred to as coolant fluid flow deflector.

Advanced heat exchanger with integrated coolant fluid flow deflector includes a base, i.e. first surface having the plurality of pin fins and at least one deflector element perpendicular to and protruding there from. In preferential embodiment pin fins are in staggered rows whereby the pin fins could equally be in aligned rows on base surface without departing from the spirit or scope of the invention.

Second aspect of the present invention is to provide the inlet and outlet aperture with maximum cross section area, while maintaining the minimum height of the heat sink. Thus the shape of the inlet and outlet aperture cross section is continuously transformed from circle to semicircle shape for providing the minimum pressure drop at coolant passage.

Yet another aspect of the present invention is to provide the boundary fin for main cavity side wall, which should effectively prevent the laminar coolant flow passing by in the gap between the cavity side wall and pin fin array.

Preferred embodiments of the present invention will now be described with reference to the accompanying drawings of advanced heat exchanger with integrated cooling fluid deflector in the reverse and throughout passageway embodiments. The reverse cavity passageway type heat exchanger (herein after referred to as first embodiment) is the heat exchanger with U turn segment where the coolant fluid flow turns its direction for about 180° at the end of the partition wall, toward to the outlet opening direction, thus the inlet and outlet openings are situated on the same side of the heat sink. As alternative, the throughout cavity passageway type heat exchanger (herein after referred to as second embodiment) is one with the inlet opening on the one side, and outlet opening situated on the other side of the heat sink.

BRIEF DESCRIPTION OF THE DRAWINGS

main cavity (2C) of the heat sink; semicircular deflector (2D) within U turn segment for forming the reverse cavity passageway; boundary fin (2E); pin fin (2F) array, where for clarity of the figure only one random pin fin in the array is labeled; cavity partition wall (2G); power electronics base plate (3); and power module (4) with plurality of local heat sources (4A), where for clarity of the figure only one random local heat source (4A) is labeled.

DETAILED DESCRIPTION

Referring to the first preferential embodiment the coolant fluid channel within the main cavity (2C) of the heat sink (2) is designed as channel with integrated U turn segment, in which the coolant fluid flow is turned by approx. 180° relative to the inlet (2A), towards to the outlet (2B) aperture. While the plurality of pin fins (2F) and the deflector (2D) is oriented perpendicular relative to the electronics base plate (3), the deflector (2D) and pin fins (2F) can be either part of the heat sink (2) or part of the electronics base plate (3). The height of the deflector (2D) is approximately the same as the height of the pin fin (2F). Thus the deflector (2D) is actually internal quasi wall of the heat sink (2) main cavity (2C), which forces the coolant fluid flow to follow the predetermined path with focus on the local heat sources (4A). The maximum wall thickness of the fluid flow deflector (2D) at the junction with the first surface is equal to the diameter of inscribed circle of the single pin fin (2F) cross section at the junction with the first surface.

Figure 3:
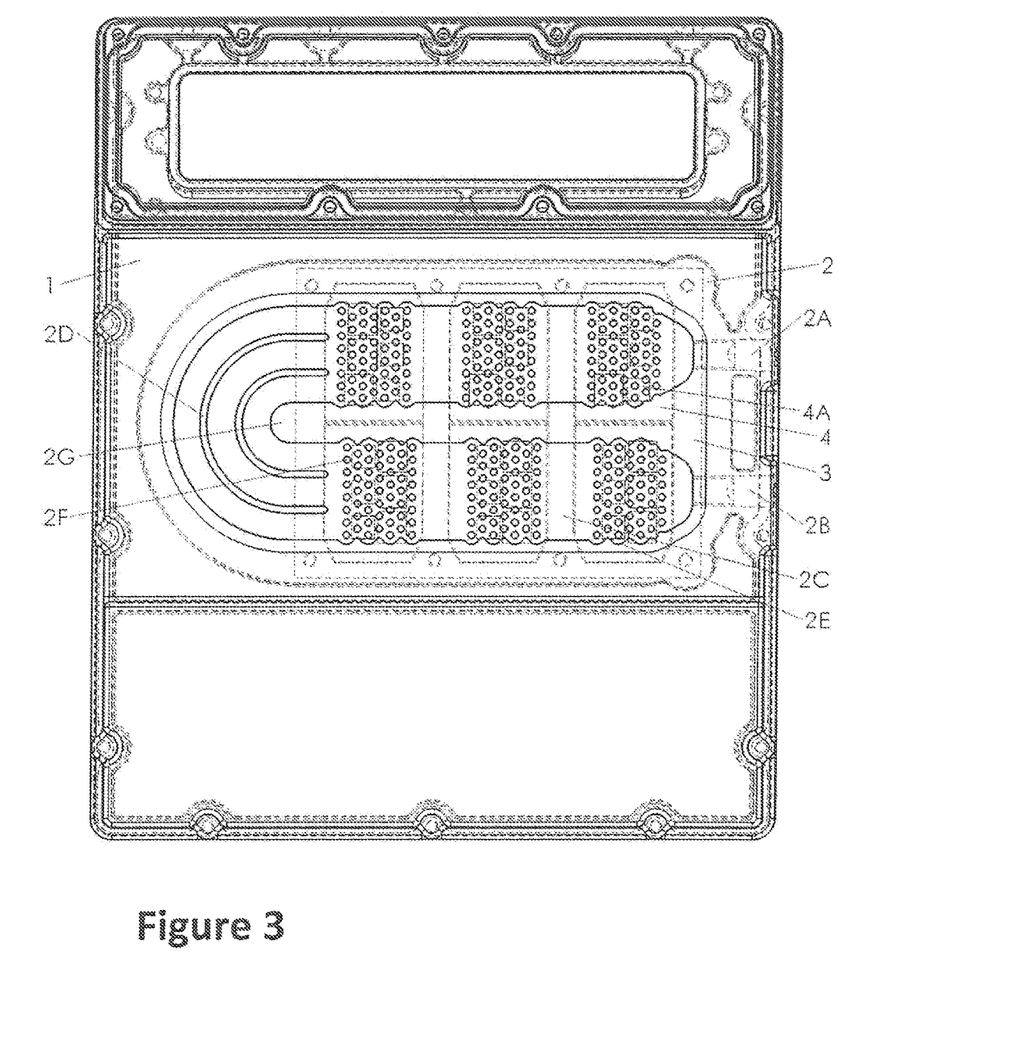
FIG. 3 is a top plan view of a pin fin heat exchanger with integrated deflector (2D) embodying a first embodiment of the present invention. For easier understanding the hidden edges of heat exchangers interior are visible and marked with dashed lines. The following items are shown and marked in FIG. 3: enclosure (1) of power electronics with integrated heat sink (2); inlet (2A) and outlet (2B) openings.
Figure 4:
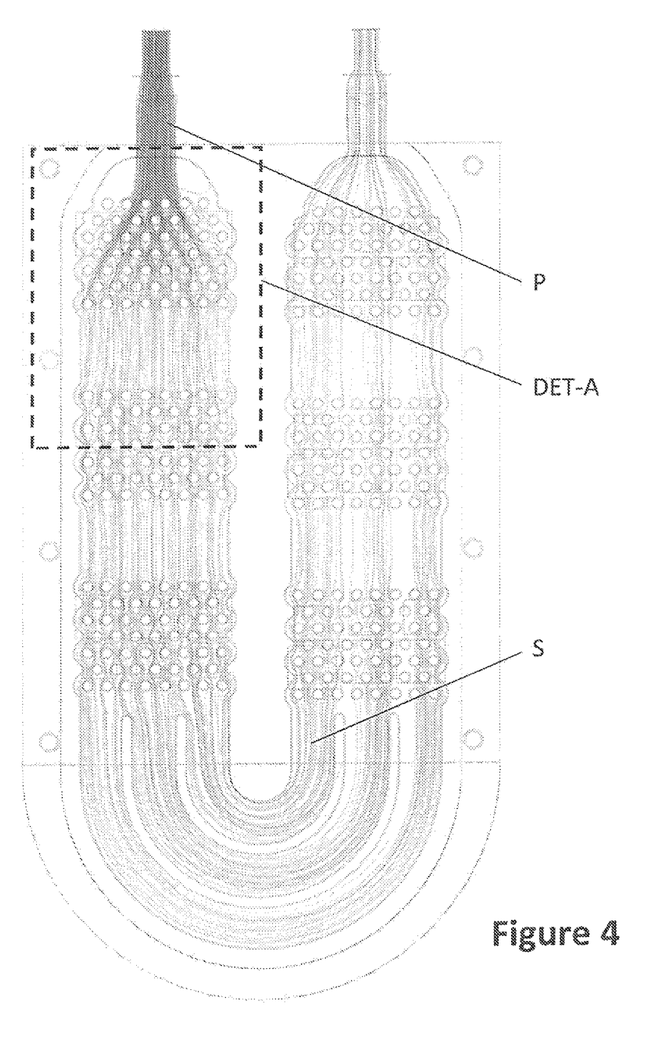
FIG. 4 is a top plan view of the heat sink (2) segment illustrating coolant fluid flow, where for clarity of the figure, elements of first embodiment are not labeled again. For easier understanding the primary coolant fluid flow (P) and one of three secondary coolant fluid flows (S) is marked on FIG. 4. Furthermore, detail (DET-A) for FIG. 5 is marked on FIG. 4.
Figure 5:
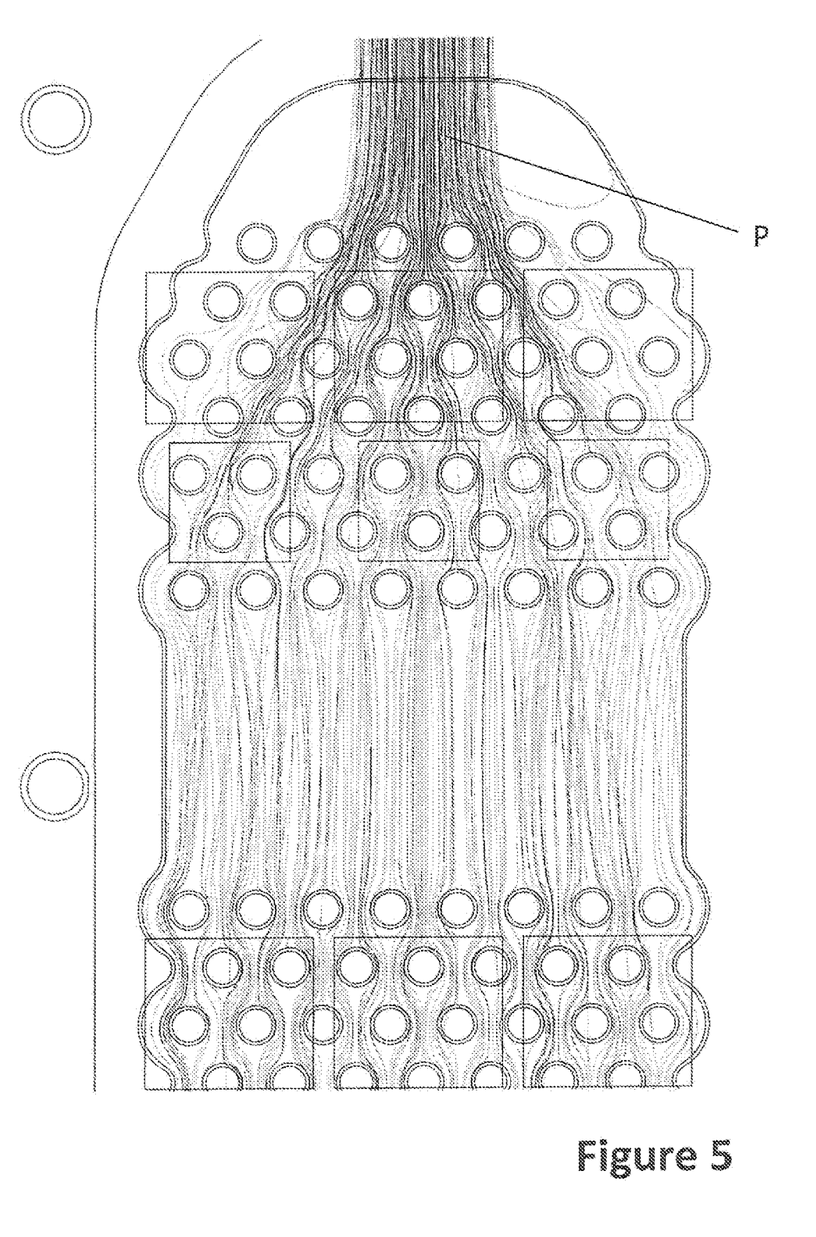
FIG. 5 is a top plan detailed view (DET-A) of the heat sinks (2) as marked on FIG. 4, where for clarity of the figure, elements of first embodiment are not labeled again. For easier understanding the primary coolant fluid flow (P) at inlet (2A) aperture is marked on FIG. 5.
Figure 7:
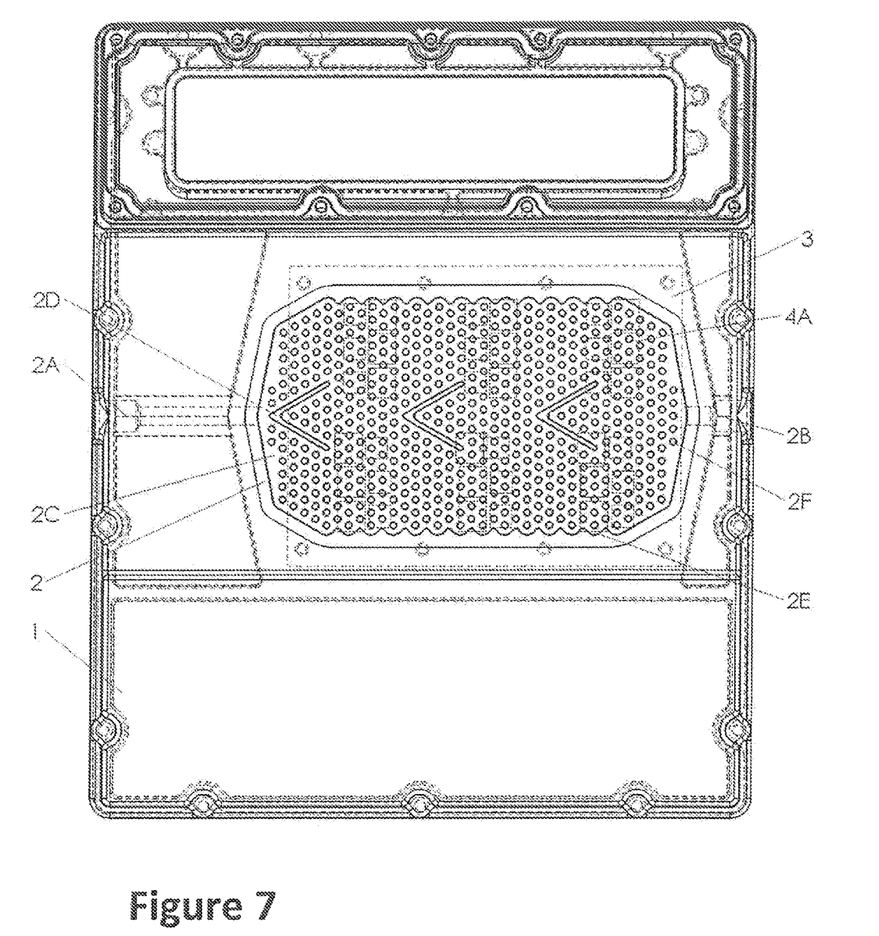
FIG. 7 is a top plan view of a pin fin heat exchanger with integrated deflector (2D) embodying a second embodiment of the present invention. For easier understanding the hidden edges of heat exchangers interior are visible and marked with dashed lines. The following items are shown and marked in FIG. 7: enclosure (1) of power electronics with integrated heat sink (2); inlet (2A) and outlet (2B) openings; main cavity (2C) of the heat sink; splitting deflector (2D); boundary fin (2E); pin fin (2F) array, where for clarity of the figure only one random pin fin in the array is labeled; power electronics base plate (3); and power module (4) with plurality of local heat sources (4A), where for clarity of the figure only one random local heat source (4A) is labeled.
Figure 8:
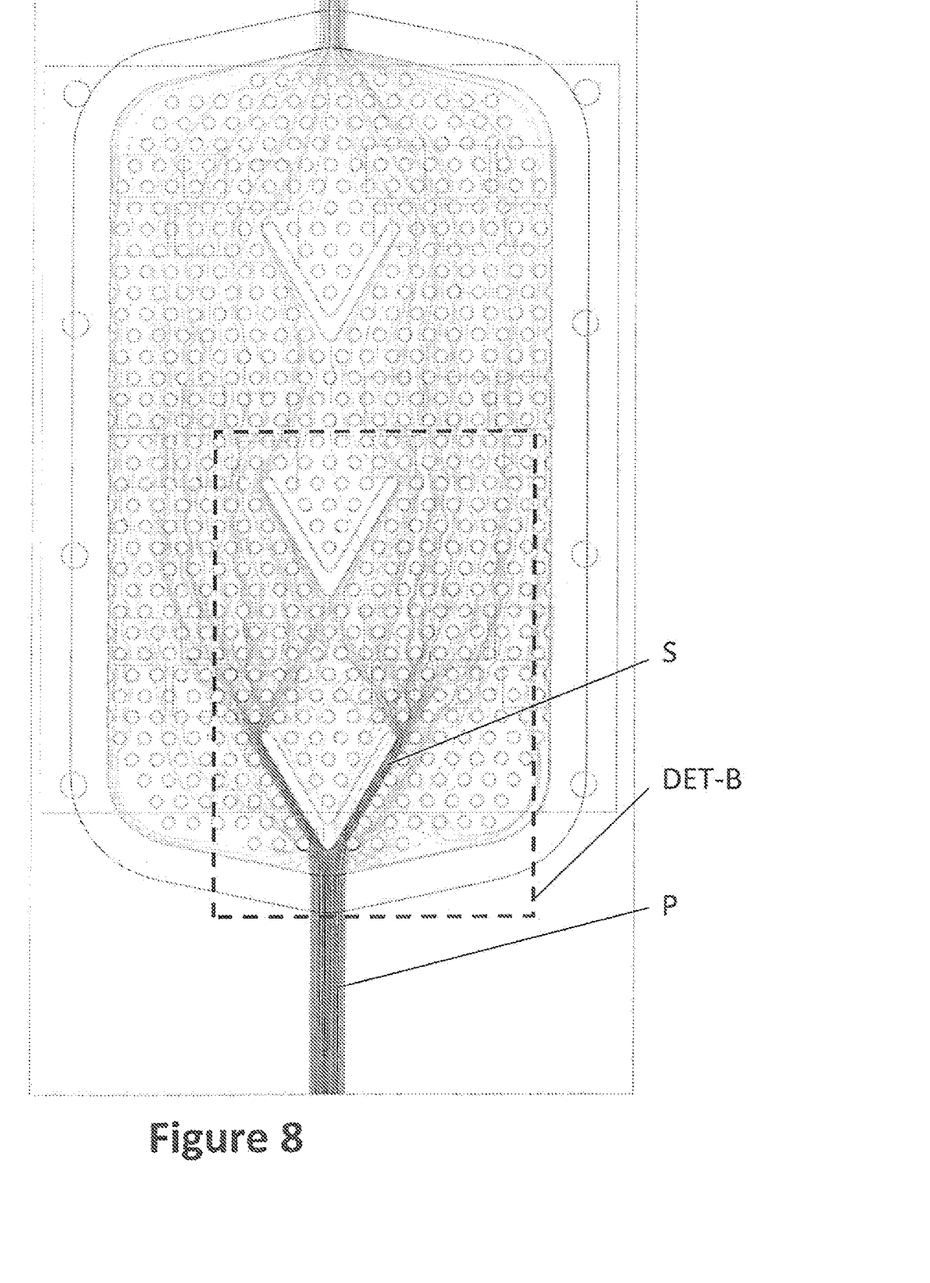
FIG. 8 is a top plan view of the heat sink (2) segment illustrating fluid flow, where for clarity of the figure, elements of second embodiment are not labeled again. For easier understanding the primary coolant fluid flow (P) and one of two secondary coolant fluid flows (S) is marked on FIG. 8. Furthermore, the scope of detail (DET-B) for FIG. 9 is marked on FIG. 8.
Figure 9:
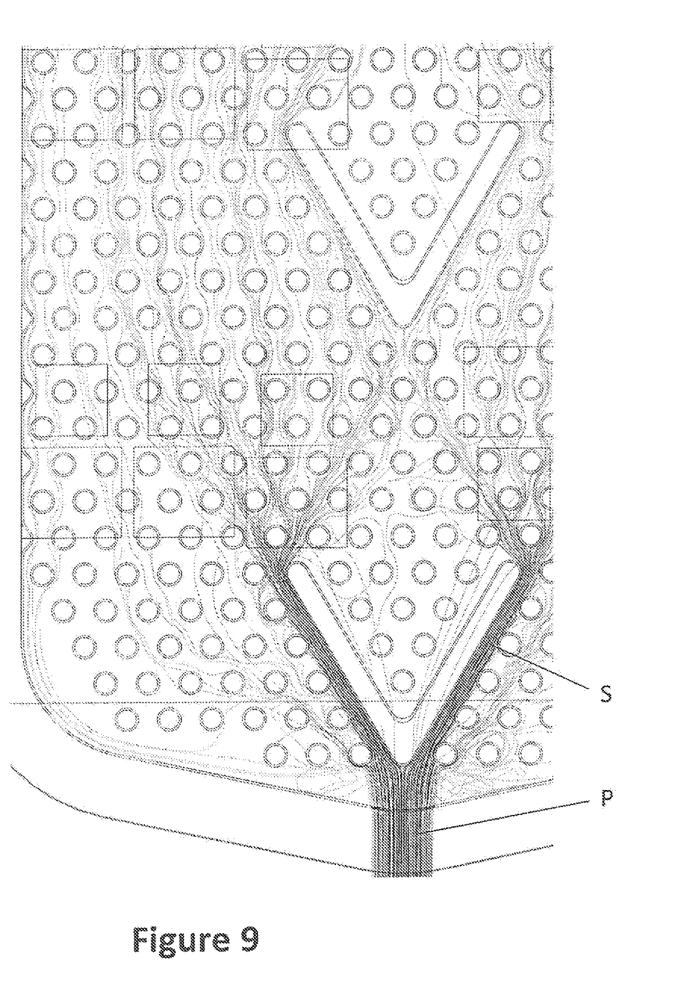
FIG. 9 is a top plan detailed view (DET-B) of the heat sink (2) as marked on FIG. 8, where for clarity of the figure elements of second embodiment are not labeled again. For easier understanding the primary coolant fluid flow (P) and secondary coolant fluid flow (S) is marked on FIG. 9.

In exposed embodiment the inlet aperture is designed as channel with changeable shape of its cross section to provide the maximum diameter for inlet (2A) and outlet (2B) fitting installation, thus achieving the minimum pressure drop value. Therefore the inlet (2A) and outlet (2B) aperture is designed as circular channel on outer side (side of the fitting mounting) and semicircular channel on inner side (the side of the heat sinks (2) main cavity (2C)). The reason for semicircular shape of inlet (2A) and outlet (2B) aperture on the inner side is the height of the pin fins (2F), which is in the most cases lower in value than the diameter of the fitting. According to the first preferential embodiment, where the pin fin (2F) array and deflector (2D) configuration is symmetrical relative to the coolant fluid flow direction, the position of the inlet (2A) and outlet (2B) aperture is nevertheless the same. Thus the inlet (2A) aperture in the first preferential embodiment can be actually the outlet (2B) aperture, or vice versa. According to the second preferential embodiment, the fluid flow cavity (2C) is not symmetrical and therefore the inlet (2A) and outlet (2B) aperture position is exactly defined with orientation of utilized deflector (2D).

The heat sink in exposed embodiments comprises the pin fins (2F), which are in preferential embodiment cylindrical in shape. It can be understood, that the pin fins (2F) can equally be also conical, elliptical, diamond, raindrop, semicircular, crescent moon type or any other shape. Furthermore, the disclosed heat sink (2) with integrated pin fins (2F) and deflector (2D) is in its preferential embodiment made of aluminum, but it can be also made of any other relevant material, such as copper, brass, copper/nickel, aluminium/brass, carbon steel and stainless steel.

Figure 1:
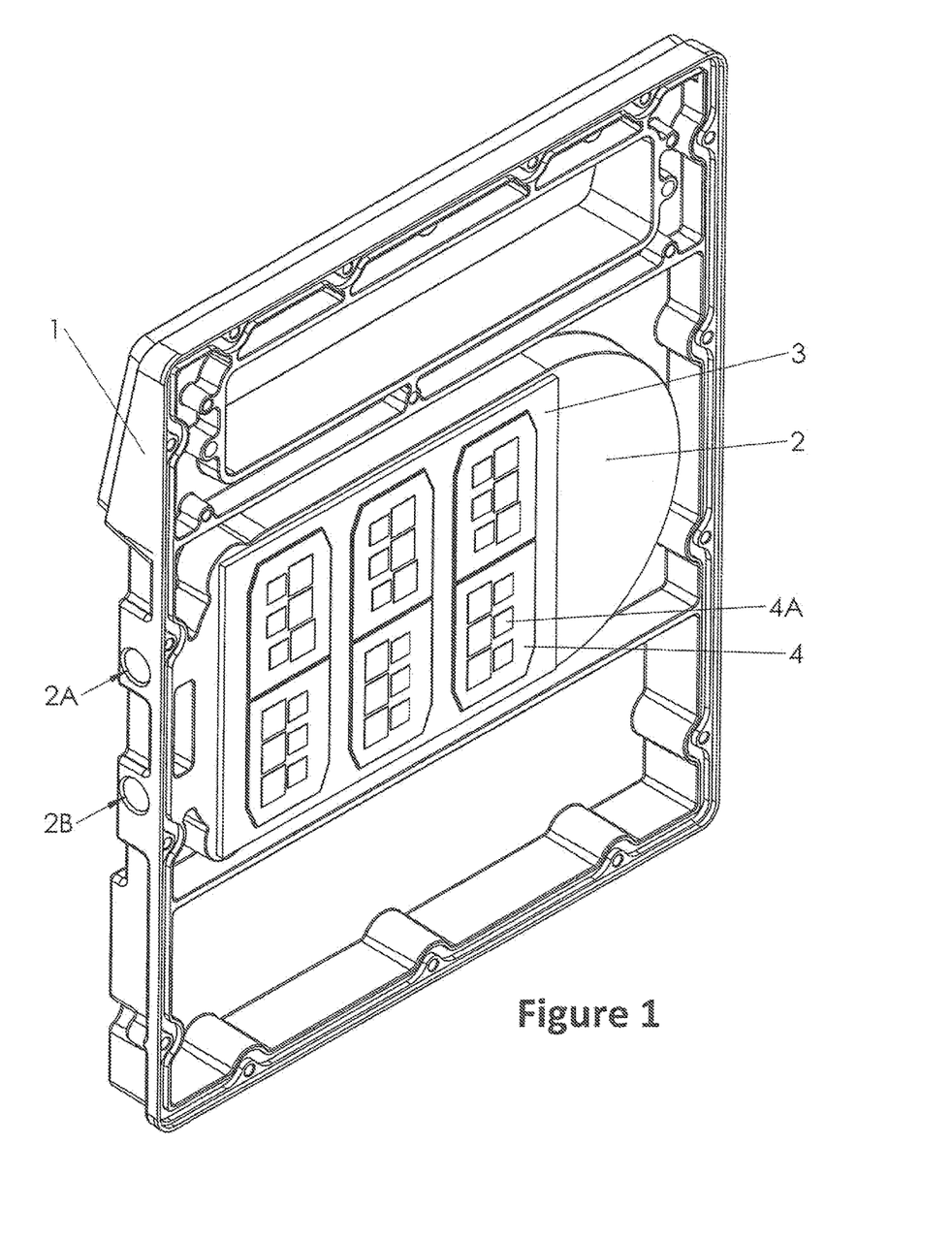
FIG. 1 is an isometric (back side) view of a pin fin heat exchanger with integrated deflector (2D) embodying a first embodiment of the present invention. The following items are shown and marked in FIG. 1: enclosure (1) of power electronics with integrated heat sink (2); inlet (2A) and outlet (2B) openings; power electronics base plate (3); and power module (4) with plurality of local heat sources (4A), where for clarity of the figure only one random local heat source (4A) is labeled, and casing of power electronics is not shown.
Figure 2:
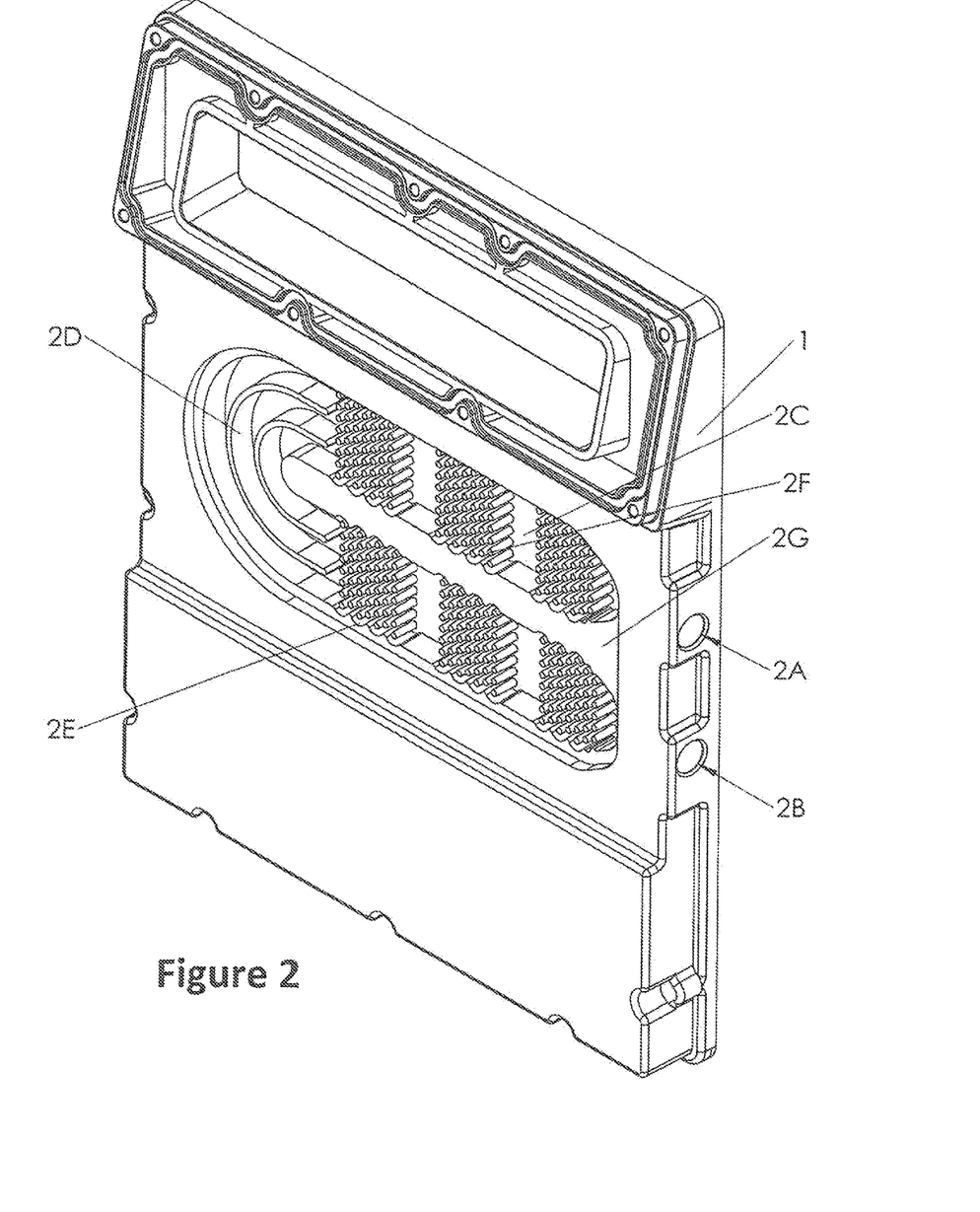
FIG. 2 is an isometric (front side) view of a pin fin heat exchanger with integrated deflector (2D) embodying a first embodiment of the present invention. The following items are shown and marked in FIG. 2: enclosure (1) of power electronics with integrated heat sink (2); inlet (2A) and outlet (2B) openings; main cavity (2C) of the heat sink; semicircular deflector (2D) within U turn segment for forming the reverse cavity passageway; boundary fin (2E); pin fin (2F) array, where for clarity of the figure only one random pin fin in the array is labeled; and cavity partition wall (2G).
Figure 6:
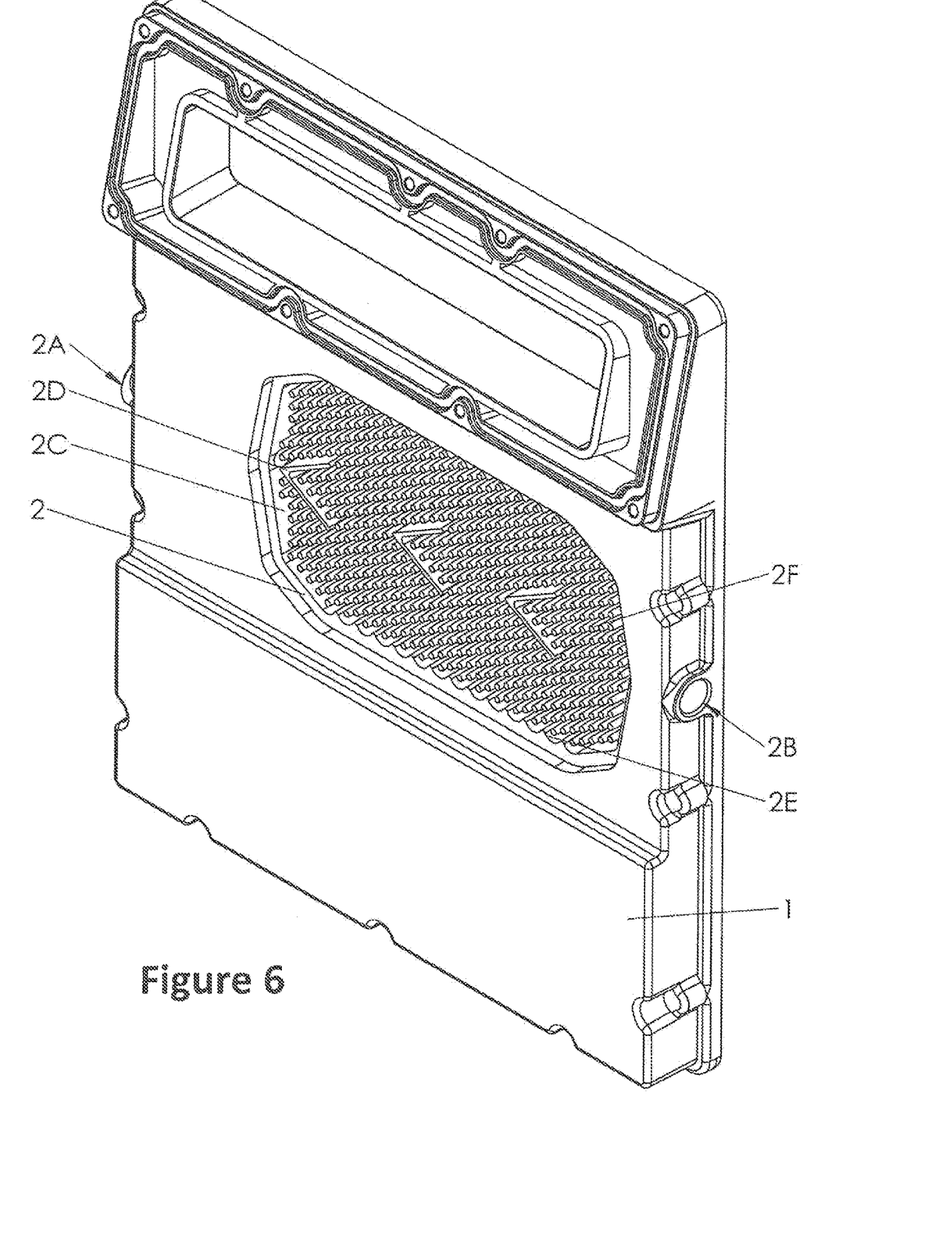
FIG. 6 is an isometric (front side) view of a pin fin heat exchanger with integrated deflector (2D) embodying a second embodiment of the present invention. The following items are shown and marked in FIG. 6: enclosure (1) of power electronics with integrated heat sink (2); inlet (2A) and outlet (2B) openings; main cavity (2C) of the heat sink; splitting deflector (2D); boundary fin (2E); and pin fin (2F) array, where for clarity of the figure only one random pin fin in the array is labeled.

To provide the solution for preventing the laminar coolant flow passing by the pin fins (2F), positioned near the side wall, the preferential embodiment further comprise the boundary fins (2E) integrated into the agitated side wall of the heat sinks (2) main cavity. Consequently the passing by coolant fluid flow is forced to follow and hit the pin fin (2F) array configuration which contributes to enhanced efficiency of the heat sink (2). The boundary fin (2E) is actually designed as row of pin fins integrated into the cavity's (2C) side wall, thus the pattern of the boundary fin (2E) is defined and dictated by the main, i.e. primary pattern of the pin fin (2F) array.

Referring to the second preferential embodiment the deflector (2D) is designed as coolant fluid flow splitting wall, which splits the primary coolant fluid flow (P) into few secondary coolant fluid flows (S) that follows the predetermined path with focus on the local heat sources (4A). Thus the deflector (2D) in the second embodiment is designed as primary coolant fluid flow (P) splitter, which splits the main fluid flow into at least two secondary fluid flows (S). Furthermore the secondary fluid flows (S) engages the local heat sources (4A) with maximum cooling flow rate at maximum velocity possible, whereby the pressure drop is minimized as well, therefore such arrangement is consequently increasing the heat dissipation efficiency of the heat sink (2).

In the foregoing description those skilled in the art will readily appreciate that modifications may be made to the invention without departing from the concepts disclosed herein. Such modifications are to be considered as included in the following claims, unless these claims expressly state otherwise.

I claim:

1. A pin fin cooling system, comprising:
    at least one first surface defining at least a base portion of the cooling system;
    at least one pin fin array of a plurality of pin fins extending from the at least one first surface;
    at least one coolant fluid flow deflector extending from the at least one first surface, wherein the coolant fluid flow deflector is configured to split a coolant fluid flow from a primary flow into at least two secondary flows that follow a predetermined path over local heat sources, wherein a maximum wall thickness of the at least one coolant fluid flow deflector at the at least one first surface is equal to a diameter of a cross-section of a single pin fin of the plurality of pin fins at the at least one first surface; and
    at least one boundary fin extending from the at least one first surface, wherein the at least one boundary fin is in the shape of a spline, at least a portion of which corresponds and matches at least a portion of a pattern of the at least one pin fin array, and wherein the at least one boundary fin is configured to guide the coolant fluid flow to come into contact with the plurality of pin fins of the at least one pin fin array.

2. A pin fin cooling system according to claim 1, wherein:
    at least one first surface of the cooling system is part of a heat sink;
    the heat sink is part of a power electronics enclosure;
    the at least one boundary fin is integrated into a side wall of the heat sink defining a main cavity; and
    inlet and outlet apertures are designed as channels with a cross section that varies from a circular shape on an outer side of the enclosure to a semicircular shape on an inner side of the enclosure in the main cavity, the inlet and outlet each having a diameter value greater than a height of the pin fins.

3. A pin fin cooling system according to claim 2, wherein:
    the at least one coolant fluid flow deflector is designed as a U turn segment of the heat sink configured to direct the coolant fluid flow to turn 180° around the at least one coolant fluid flow deflector, the U turn segment being positioned at the end of a partition wall.

4. A pin fin cooling system according to claim 3, wherein a cross-section of the pin fin has a shape of at least one of a conical, elliptical, diamond, semicircular, raindrop or crescent moon shape type.

5. A pin fin cooling system of claim 4, wherein the heat sink is made of aluminium, copper, brass, copper/nickel, aluminium/brass, carbon steel or stainless steel material.

6. A pin fin cooling system according to claim 1, wherein:
    the at least one first surface of the cooling system is a part of a heat sink;
    the heat sink is part of a power electronics base plate; and
    the power electronics base plate further includes the local heat sources.

7. A pin fin cooling system according to claim 6, wherein a cross-section of the pin fin has a shape of at least one of a conical, elliptical, diamond, semicircular, raindrop or crescent moon shape type.

8. A cooling system, comprising:
    an enclosure defining a cavity, the enclosure having an inlet and outlet through which a coolant fluid enters and exits the cavity;
    at least one pin fin array of a plurality of pin fins disposed within the cavity; and
    at least one coolant fluid flow deflector plate configured to divide a primary flow of the coolant fluid into at least two secondary flows;
    at least one boundary fin extending from an interior surface of the enclosure, wherein the at least one boundary fin is in the shape of a spline, at least a portion of which corresponds and matches at least a portion of a pattern of the at least one pin fin array, and wherein the at least one boundary fin is configured to guide the coolant fluid flow to come into contact with the plurality of pin fins of the at least one pin fin array.

9. A cooling system according to claim 8, wherein the at least one pin fin array includes at least one inlet-side pin fin array disposed between the inlet and the at least one coolant fluid flow deflector plate, and at least one outlet-side second pin fin array disposed between the at least one coolant fluid flow deflector and the outlet.

10. A cooling system according to claim 9, further comprising a cavity partition wall positioned within the cavity such that the cavity is U-shaped, and the inlet and the outlet are on a same side of the enclosure.

11. A cooling system according to claim 10, wherein the at least one coolant fluid flow deflector is located in a bend portion of the U-shaped cavity, and the at least one inlet-side pin fin array and the at least one outlet-side pin fin array are on opposing sides of the cavity partition wall.

12. A cooling system according to claim 8, further comprising a cavity partition wall positioned within the cavity such that the cavity is U-shaped, and the inlet and the outlet are on a same side of the enclosure.

13. A cooling system according to claim 12, wherein the at least one coolant fluid flow deflector is located in a bend portion of the U-shaped cavity.

* * * * *